United States Patent [19]

Rose

[11] Patent Number: 4,853,545

[45] Date of Patent: Aug. 1, 1989

[54] PARTICLE BEAM APPARATUS FOR LOW-ERROR IMAGING OF LINE-SHAPED SUBJECTS

[75] Inventor: Harald Rose, Darmstadt, Fed. Rep. of Germany

[73] Assignee: Siemens Aktiengesellschaft, Berlin and Munich, Fed. Rep. of Germany

[21] Appl. No.: 66,212

[22] Filed: Jun. 25, 1987

[30] Foreign Application Priority Data

Dec. 23, 1986 [DE] Fed. Rep. of Germany ... 8634545[U]

[51] Int. Cl.$^4$ ................................................. H01J 3/14
[52] U.S. Cl. ....................... 250/396 R; 250/396 ML; 250/398
[58] Field of Search ........... 250/396 R, 396 ML, 398, 250/492.2, 492.23

[56] References Cited

U.S. PATENT DOCUMENTS

| | | | |
|---|---|---|---|
| 2,919,381 | 12/1959 | Glaser | 250/396 R |
| 3,753,034 | 8/1973 | Spicer | 250/396 R |
| 4,362,942 | 12/1982 | Yasuda | 250/398 |
| 4,389,571 | 6/1983 | Crewe | 250/396 R |
| 4,414,474 | 11/1983 | Crewe | 250/396 R |
| 4,469,950 | 9/1984 | Taylor et al. | 250/492.2 |
| 4,472,636 | 9/1984 | Hahn | 250/492.2 |
| 4,514,638 | 4/1985 | Lischke et al. | 250/492.2 |
| 4,724,328 | 2/1988 | Lischke | 250/492.2 |

FOREIGN PATENT DOCUMENTS 3504714 8/1986 Fed. Rep. of Germany.

*Primary Examiner*—Bruce C. Anderson
*Attorney, Agent, or Firm*—Hill, Van Santen, Steadman & Simpson

[57] ABSTRACT

An improved particle beam apparatus for imaging line-shaped subjects onto an image surface, for example, a row of perforations of an aperture diaphragm on a surface of a semiconductor member to be structured characterized by the isotropic and anisotropic distortions being compensated by the insertion of a first multi-pole optics into the beam path under the subject. Astigmatisms produced by the first multi-pole optics are compensated by a second multi-pole optic that is inserted in the beam path immediately above the imaging lens.

14 Claims, 2 Drawing Sheets

PARTICLE BEAM APPARATUS FOR LOW-ERROR IMAGING OF LINE-SHAPED SUBJECTS

BACKGROUND OF THE INVENTION

The present invention is directed to a particle beam apparatus comprising a particle beam source, at least one condenser lens, a line-shaped subject and an imaging lens for imaging the line-shaped subject onto an image surface.

A particle beam apparatus having a particle beam source, at least one condenser lens, a line-shaped subject and imaging lens for imaging the line shaped subject onto an image surface are used for lithographic production of microstructures and such an apparatus is disclosed in copending U.S. Pat. application Ser. No. 824,237, which was filed Jan. 30, 1986, and now U.S. Pat. No. 4,724,328, whose disclosure is incorporated by reference thereto and was based on German Patent Application No. 35 04 714. The line-shaped subject is thereby composed of a line-shaped multi-perforation aperture diaphragm inserted into the beam path of the particle beam source and this aperture serves to generate a plurality of particle beam probes. The latter impinge on the surface of a body covered with a photoresist layer, particularly a semiconductor body, that is to be structured, and the photoresist layer is exposed in the respective points of incidence.

However, in such an imaging of a line-shaped subject onto a surface, particularly onto the surface of a semiconductor body to be structured, disturbing distortions will occur. For example, although the multi-perforation structure of the aperture diaphragm will have a fixed spacing between perforations, the image spots produced and exposed by the plurality of particle beam probes are not equal distance from one another and will lie farther and farther apart with increasing distance from the optical axis of the particle beam apparatus and will also have larger and larger image spot dimensions (isotropic distortion). In addition, unlike a straight line of perforations in the aperture diaphragm, the image spots will, likewise, not lie on a straight line, but instead will be arranged on an S-shaped curve, which is referred to as anisotropic distortion. Deviations in the shape of the image spot in comparison to the shape of the perforations in the aperture diaphragm generating the particle beam probes also occur due to these distortions.

SUMMARY OF THE INVENTION

The object of the present invention is to provide a particle beam apparatus of the above-described species that enables a low-error imaging of line-shaped subject.

This is inventively achieved by an improvement in a particle beam apparatus comprising a particle beam source having a beam path, at least one condensor lens, a line-shaped subject, and an imaging lens arranged in the path with the imaging lens arranging the line-shaped subject onto an image surface. The improvements are the provision of a first multi-pole optics in the beam path directly after the line-shaped subject and providing a second multi-pole optics being arranged in the beam path immediately before the imaging lens.

A special advantage obtained with the invention is that the isotropic and anisotropic distortions occurring in the imaging of the line-shaped subjects are largely compensated.

In the preferred embodiments, the first and second multi-pole optics are each fashioned as an octopole arrangement which preferably have eight electrodes and eight pole shoes or pieces. In the preferred embodiment, additional rotation symmetry field lenses can be inserted in the beam path so that a zero position of either the field rays or the axial rays proceeding through the optical axis in the region of the line-shaped subject to be imaged lie in the center of each lens of the particle beam apparatus that are in the beam path after the first field lens.

DESCRIPTION OF THE PREFERRED EMBODIMENTS

Figure 1:
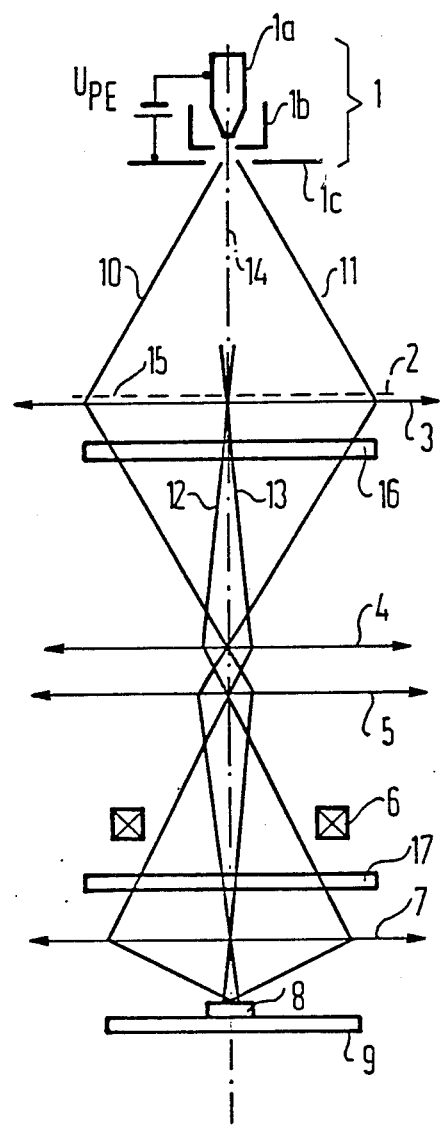
FIG. 1 is a schematic view illustrating the beam path of a particle beam apparatus constructed in accordance with the present invention.

The principles of the present invention are particularly useful when incorporated in a particle beam apparatus, schematically illustrated in FIG. 1. This apparatus is employable for lithography purposes and is fashioned as an electron beam apparatus. It comprises an electron beam source 1 composed of a cathode 1a, a Wehnelt cylinder 1b and an anode 1c, and the source will have an accelerating voltage $U_{PE}$ being applied between the anode 1c and the cathode 1a. The apparatus will include a subject 2 to be imaged, for example, an aperture diaphragm, a first field lens 3 immediately following the aperture diaphragm 2 and, as illustrated, is placed immediately below the diaphragm, a condensor lens 4, a second field lens 5, a deflection system 6 and an imaging lens 7, which will image the beams onto a member 8 to be structured, particularly a member of doped semiconductor material which is situated on a table or stage 9. The electron beams emerging from the cathode 1a are illustrated by field rays 10 and 11, which laterally limit the image field on the member 8 and by what are referred to as axial rays 12 and 13, which penetrate the aperture diaphragm along the optical axis 14. The aperture diaphragm 2 is constructed disk-shaped and is provided with a line-shaped perforation structure that, for example, is formed of rectangular or quadratic recesses, which are indicated by gaps 15. An advantageous embodiment of the aperture diaphragm 2 is disclosed in greater detail in the above-mentioned U.S. patent application Ser. No. 824,237. A disclosure of the production of the microstructures on the semiconductor member can also be found in the above-mentioned U.S. patent application. With the assistance of the deflection system 6, the electron beam probes can sweep the surface of the member 8.

As may be derived from the illustrated beam path, the cross section of the electron beam probes that are established in the plane of the aperture diaphragm 2 by the dimensions of the recesses 15 are imaged onto the surface of the member 8 greatly demagnified by the lenses 4, 5 and 7. As a result of the linear extent of the row of perforations to be imaged, however, the above-mentioned isotropic and anisotropic distortions will occur. These potentially have a considerable deteriorating effect on the structure being generated. In order to compensate these distortions, a multi-pole optics is inserted into the beam path in accordance with the present invention. This multi-pole optics 16 is expediently arranged immediately under or after the subject 2 which is being imaged so that the beams passing through the subject 2 are received by the multi-pole optics the multi-pole optics, as described in greater detail here, can successfully compensate for the imaging distortions. However, additional or slight astigmatism of the oblique beams will occur. The isotropic and anisotropic astigmatism of the overall imaging system, namely particularly the astigmatism of the third order, are in turn compensated or eliminated with a second multi-pole optics 17, which is arranged in the beam path immediately above or before the imaging lens 7.

Figure 2:
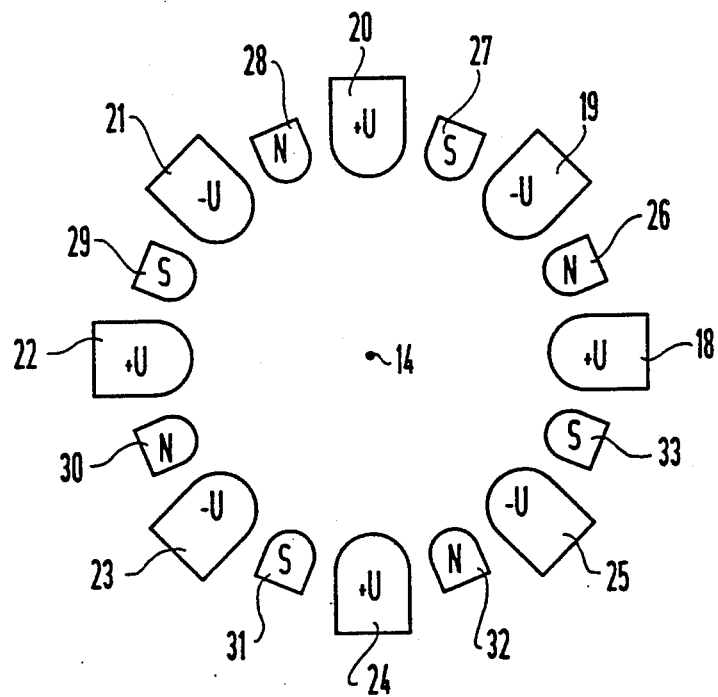
FIG. 2 is a plan view of a multi-pole optics that can be inserted in the beam path of the particle beam apparatus of FIG. 1 in accordance with the present invention.

A preferred embodiment of the multi-pole optics 16 or, respectively, 17, is illustrated in FIG. 2. What is hereby involved is an octopole arrangement wherein eight electrostatic electrodes 18-25 are arranged roughly along a circle, whose center lies approximately on the optical axis 14. The electrodes 18, 20, 22 and 24 are all wired with a voltage $+U$ and the electrodes 19, 21, 23 and 25 are all wired with a voltage $-U$. In addition, eight magnetic pole pieces or shoes 26-33 are provided and these respectively lie between the electrodes 18-25. The magnetic pole pieces 26, 28, 30 and 32 each represent a north pole, while the magnetic pole pieces 27, 29, 30 and 33 each represent a south pole. By separately setting first the voltage U and, second, the magnetic strength that occurs due to the setting of the current in the excitation windings allocated to each of the pole pieces, both the strength as the azimuthal orientation of the field of the octopole arrangement of FIG. 2 that is used as a multi-pole optics 16 can be successfully set to set values so that the distortion values are largely compensated. When a second octopole arrangement of FIG. 2 is used as a multi-pole optics 17, then one further succeeds in largely compensating for the total isotropic and anisotropic astigmatism, particularly that of the third order, of the entire imaging system by setting both the strength as the azimuthal orientation of the field for the multi-pole optics 17.

With particular advantage, the imaging system is fashioned so that the curvature of the image field limiting the image field of the surface of the member 8 becomes minimal. This is achieved in that the rotationally symmetrical field lens 3 and 5 are excited and arranged so that a zero position of either the field rays 10, 11 or of the axial rays 12, 13, lie in the center of each of the lenses 4, 5 and 7.

In a departure from the above-described embodiment of the multi-pole optics 16 and 17, these can be fashioned with some other number of a plurality of electrodes and magnetic pole pieces. In particular, a multi-pole optics having 16 electrodes and 16 magnetic pole pieces can be provided.

Although various minor modifications may be suggested by those versed in the art, it should be understood that I wish to embody within the scope of the patent granted hereon all such modifications as reasonably and properly come within the scope of my contribution to the art.

I claim:

1. In a particle beam apparatus comprising a particle beam source with a beam path, a condensor lens, a line-shaped subject and an imaging lens being arranged in the beam path, said imaging lens imaging the line-shaped subject onto an image surface, the improvements comprising a first multi-pole optics being positioned in the beam path after the line-shaped subject, a second multi-pole optics being arranged in the beam path immediately before said imaging lens, and said condensor lens being positioned between said first multi-pole optics and said second multi-pole optics.

2. In a particle beam apparatus according to claim 1, which includes additional rotational symmetry field lenses being inserted in the beam path so that a zero position for either the field rays or the axial rays proceeding along the optical axis in the region of the line-shaped subject to be imaged lie in the center of every lens of said particle beam apparatus that lie in the beam path after the first field lens.

3. In a particle beam apparatus according to claim 1, wherein said first and second multi-pole optics are constructed as octopole arrangements.

4. In a particle beam apparatus according to claim 3, wherein additional first and second rotational symmetry field lenses are inserted in the beam path with the first field lenses being inserted in the path immediately following the line-shaped subject and the second field lens being inserted in the beam path immediately following the condensor lens so that either the field rays or the axial rays proceeding through the optical axis in the region of the line-shaped subject are imaged in the center of every lens of the condensor lens, the imaging lens and the second field lens that lie after the first field lens.

5. In a particle beam apparatus according to claim 3, wherein the octopole arrangement comprises eight electrostatic electrodes and eight magnetic pole pieces.

6. In a particle beam apparatus according to claim 5, wherein an additional first rotationally symmetric field lens and a second rotationally symmetric field lens are inserted in the beam path with the first lens being positioned immediately following the line-shaped subject and the second lens being positioned between the condensor lens and the imaging lens so that a zero position of either the field rays or the axial rays proceeding through the optical axis in the region of the line-shaped subject will be imaged to lie in the center of the condensor lens, the imaging lens and the second field lens of the particle beam apparatus that follow the first field lens.

7. A particle beam apparatus comprising a particle beam source with a beam path; a condensor lens, a line-shaped subject, and an imaging lens for imaging said line-shaped subject onto a specimen being arranged in the beam path, said condensor lens being between the line-shaped subject and the imaging lens; a first electromagnetic, multipole optics being arranged in the beam path between said line-shaped subject and said condensor lens for the compensation of the distortion occurring in the imaging of said line-shaped subject, and a second electro-magnetic, multipole optics being arranged in the beam path between said condensor lens and said imaging lens for compensation of an astigmatism of a system for imaging of the line-shaped subject.

8. A particle beam apparatus according to claim 7, wherein said second multipole optics is arranged immediately before said imaging lens.

9. A particle beam apparatus according to claim 7, wherein said first multipole optics is composed of a first electrical multipole element comprising at least eight electrostatic electrodes and of a first magnetic multipole element comprising at least eight magnetic pole shoes.

10. A particle beam apparatus according to claim 9, wherein each electrode of said first electrical multipole element is arranged between two pole shoes of said first magnetic multipole element.

11. A particle beam apparatus according to claim 7, wherein said second multipole optics is composed of a second electrical multipole element comprising at least eight electrostatic electrodes and of a second magnetic multipole element comprising at least eight magnetic pole shoes.

12. A particle beam apparatus according to claim 11, wherein each electrode of said second electrical multipole element is arranged between two pole shoes of said second magnetic multipole element.

13. A particle beam apparatus comprising a particle beam source with a beam path; a condensor lens between a line-shaped subject and a lens for imaging said line-shaped subject onto a specimen being arranged in the beam path; and an electro-magnetic multipole optics arranged in the beam path between said line-shaped subject and said condensor lens for the compensation of the distortion occurring in the imaging of said line-shaped subject, said electro-magnetic multipole optics comprising a magnetic multipole element being composed of at least eight magnetic poles and an electrical multipole element being composed of at least eight electrostatic electrodes.

14. A particle beam apparatus according to claim 13, which includes a second electro-magnetic multipole optics arranged in the beam path between said condensor lens and said imaging lens for the compensation of the astigmatism produced by said first mentioned electro-magnetic multipole optics.

* * * * *